(12) United States Patent
Murase et al.

(10) Patent No.: US 6,217,978 B1
(45) Date of Patent: Apr. 17, 2001

(54) INCOMBUSTIBLE HONEYCOMB RADIO ABSORPTIVE MATERIAL AND RADIO ABSORBER USING THE SAME

(75) Inventors: Taku Murase; Naoyoshi Sato; Hiroshi Kurihara; Toshifumi Saitoh; Motonari Yanagawa, all of Tokyo; Kozo Hayashi; Kyoichi Fujimoto, both of Kakamigahara, all of (JP)

(73) Assignees: TDK Corporation, Tokyo; Tokiwa Electric Co., Kakamigahara, both of (JP)

( * ) Notice: Subject to any disclaimer, the term of this patent is extended or adjusted under 35 U.S.C. 154(b) by 0 days.

(21) Appl. No.: 09/384,383

(22) Filed: Aug. 27, 1999

(30) Foreign Application Priority Data

Aug. 28, 1998 (JP) .................................. 10-242989

(51) Int. Cl.$^7$ ...................................... B32B 3/12
(52) U.S. Cl. ................................ 428/116; 342/1
(58) Field of Search ................... 428/116, 118; 342/1

(56) References Cited

U.S. PATENT DOCUMENTS

| | | | |
|---|---|---|---|
| 3,440,655 | * 4/1969 | Wesch et al. ............................ | 342/1 |
| 5,594,218 | 1/1997 | Diaz et al. ......................... | 181/292 X |
| 5,627,541 | * 5/1997 | Haley et al. ............................ | 342/1 |
| 5,668,070 | * 9/1997 | Hong et al. .......................... | 342/1 X |
| 5,688,348 | 11/1997 | Diaz et al. ........................... | 156/197 |
| 5,851,403 | * 12/1998 | Petrisko et al. ...................... | 210/670 |
| 5,853,889 | * 12/1998 | Joshi et al. ......................... | 428/411.1 |

FOREIGN PATENT DOCUMENTS

| | | |
|---|---|---|
| 2 678 132 | 12/1992 | (EP) . |
| 3-205000 | 9/1991 | (JP) . |
| 5-243781 | 9/1993 | (JP) . |
| 6-132691 | 5/1994 | (JP) . |
| 8-67544 | 3/1996 | (JP) . |
| 9-307268 | 11/1997 | (JP) . |

OTHER PUBLICATIONS

Patent Abstracts of Japan, vol. 015, No. 200 (E–1070), May 22, 1991, JP 03–053594, Mar. 7, 1991.

* cited by examiner

Primary Examiner—Francis J. Lorin
(74) Attorney, Agent, or Firm—Oblon, Spivak, McClelland, Maier & Neustadt, P.C.

(57) ABSTRACT

An incombustible honeycomb radio absorptive material is disclosed, forming a honeycomb structure that is an aggregate of many cells, wherein (i) the honeycomb structure contains a hydrated inorganic compound and an electrically conductive material, or (ii) the honeycomb structure contains a hydrated inorganic compound and has an electrically conductive layer made of an electrically conductive material being formed on the surface of the structure. A radio absorber is also disclosed, wherein a large number of the incombustible honeycomb radio absorptive materials are disposed on a shield panel or a ferrite tile covering he shield panel is provided. The incombustible honeycomb radio absorptive material and the radio absorber using it according to the invention are suitably used for an anechoic chamber and are excellent in the fire resistance and the radio absorption effect.

22 Claims, 5 Drawing Sheets

INCOMBUSTIBLE HONEYCOMB RADIO ABSORPTIVE MATERIAL AND RADIO ABSORBER USING THE SAME

BACKGROUND OF THE INVENTION

1. Field of the Invention

The present invention relates to an incombustible honeycomb radio absorptive material and to a radio absorber using it. More specifically, the invention relates to an incombustible honeycomb radio absorptive material which is suitably used for an anechoic chamber (radio shielding room), has a high incombustibility, is excellent in radio absorptivity, is lightweight, and has a high strength, as well as to a radio absorber using the material.

2. Description of the Related Art

Recently, for an advanced information society, the utilization of radio waves has been rapidly expanded particularly in the mobile communication field. Also, with today's innovative progress of microelectronics techniques, various kinds of electronic instruments have come into widespread use. Under these circumstances, a hindrance occurred by unnecessary electromagnetic waves, such as electromagnetic wave noises, from those electronic instruments has become a large problem.

The measurement of said electromagnetic wave noises is usually carried out in an anechoic chamber where no reflection is caused of electromagnetic waves, and the inside wall of the anechoic chamber is made with a radio absorber. For the radio absorber, it is mostly used an organic material, such as foamed polystyrene and foamed polyurethane, where each being compounded with carbon black for improving electric conductivity, however, incombustibility is low of foamed polystyrene or foamed polyurethane. As radio interference has increased recently, the test of a large electric power, such as an immunity test, would be a mandatory one in Japan. As the anechonic chamber requires works in a closed space, a radio absorber to be used for said chamber is required to have, in addition to radio absorptivity, a higher incombustibility for improving safety.

Radio absorbers having incombustibility have been proposed as follows: a heat-resisting incombustible radio absorber made of a shaped material formed by cumulating and bonding many closed cellular inorganic particles with a heat-resisting inorganic adhesive having a definite amount of carbon black dispersed therein (Japanese Patent No. 2,743,227); a radio absorber obtained by attaching and fixing an electrically conductive material to a molded material comprising ceramic or glass short fibers each having a specific aspect ratio by penetration and impregnation (Japanese Patent Laid-Open No. 307,268/1997); and a radio absorber made of a composition constituted by a cement, a light-weight aggregate, non-electrically conductive fibers, and a synthetic resin emulsion (Japanese Patent Laid-Open No. 67,544/1996).

However, the heat-resisting incombustible radio absorber of Japanese Patent No. 2,743,227 is structurally weak, having low mechanical strength, and as it is formed with many closed cellular particles, dusts are apt to be generated during assembling the absorber and by a mutual-contact of the particles.

In the radio absorber proposed in Japanese Patent Laid-Open No. 307268/1997, a manufacturing cost is very high.

In the radio absorber proposed in Japanese Patent Laid-Open No. 67,544/1996, large amounts of organic hollow particles and an organic binder are used to reduce a weight of a mortal be lightweight, however, as they are quasi-incombustible materials or smoke-producing materials, fuming amounts from them are greatly large compared to those from incombustible materials.

Furthermore, the above conventional radio absorbers each is heavy in its own weight, and therefore, each of them is easily distorted by its own weight to cause deformation or breakage.

In order to prevent the deformation or breakage, several techniques have been proposed so that radio absorbers be made in honeycomb structures (Japanese Patent Laid-Open Nos. 205,000/1991 and 132,691/1994, etc.). However, those radio absorbers are quite inferior in fire resistance, as the supporting materials therefor are papers or plastics.

SUMMARY OF THE INVENTION

An object of the invention is to provide an incombustible honeycomb radio absorptive material which is excellent in fire resistance and radio absorptivity, is lightweight, and has a high strength.

Another object of the invention is to provide a radio absorber using the radio absorptive material above.

That is, one aspect of this invention is directed to an incombustible honeycomb radio absorptive material forming a honeycomb structure that is an aggregate of many cells, where the honeycomb structure contains a hydrated inorganic compound and an electrically conductive material.

Also, another aspect of this invention is directed to an incombustible honeycomb radio absorptive material forming a honeycomb structure that is an aggregate of many cells, wherein the honeycomb structure contains a hydrated inorganic compound, and has an electrically conductive layer made of an electrically conductive material formed on the surface of the structure.

A still another aspect of this invention is directed to a radio absorber wherein a large number of the incombustible honeycomb radio absorptive materials are disposed on a shield panel or on a ferrite tile covering the shield panel.

DESCRIPTION OF THE PREFERRED EMBODIMENTS

The incombustible honeycomb radio absorptive material of the invention forms a honeycomb structure which is made of an aggregate of many cells, wherein said honeycomb structure contains a hydrated inorganic compound as a main constituent and contains an electrically conductive material (in the first embodiment); or forms a honeycomb structure which is made of an aggregate of many cells, wherein said honeycomb structure contains a hydrated inorganic compound as a main constituent, and has an electrically conductive layer made of an electrically conductive material formed on the surface of the structure (in the second embodiment).

That is, in the first embodiment of this invention, the honeycomb structure itself is imparted with incombustibility as well as radio absorptivity, and is used as the incombustible honeycomb radio absorptive material. In the second embodiment of this invention, the honeycomb structure is imparted with incombustibility, and further an electrically conductive layer is formed on the surface of the structure to impart radio absorptivity therefor, and the resulting assembly of the honeycomb structure and the electrically conductive layer is used as the incombustible honeycomb radio absorptive material.

The term "incombustibility" used herein means bearing the building material test (Notification No. 1828 of the Ministry of Assembly, Japan), that is, when a sample is placed in a furnace of 750° C. for 20 minutes, if a temperature rise in the furnace, i.e., a temperature rise of the sample, is lower than 50° C., then the sample is judged to be incombustible. The term "radio absorptivity" means the characteristics of the material whose reflectivity is −20 dB or lower.

The honeycomb structure of the present invention may be produced by any arbitrary methods, such as a method of integral molding and a method of sticking sheets to each other, however, it is preferably obtained by producing wet sheets from a slurry containing a hydrated inorganic compound as a main constituent (in the first embodiment, further containing the electrically conductive material), and then drying and solidifying the wet sheets to form sheets, followed by laminating the sheets in a honeycomb form.

Figure 1:
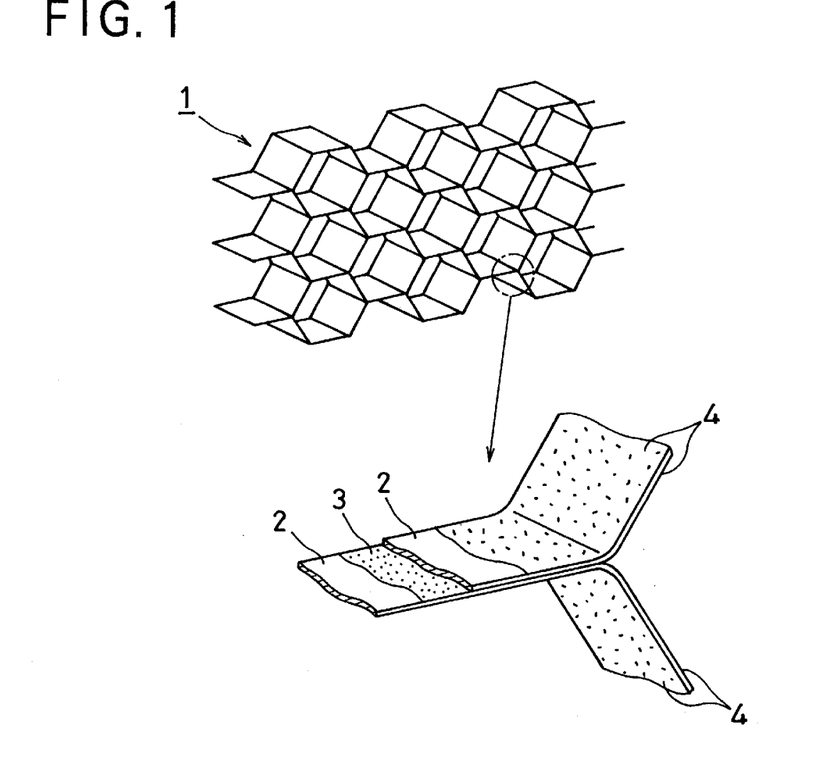
FIG. 1 is a partial slant view showing an embodiment of the incombustible honeycomb radio absorptive material of this invention.

For example, in FIG. 1, a honeycomb structure 1 is formed by laminating plural sheets 2 by an inorganic adhesive 3, followed by extending. Each sheet 2 contains a hydrated inorganic compound as a main constituent. Any arbitrary adhesives may be used as the inorganic adhesive 3, such as a water glass-based adhesive, a phosphate-based adhesive, a colloidal silica-based adhesive, and a colloidal alumina-based adhesive, and the like. An organic adhesive such as vinyl acetate, etc., may be used in place of the inorganic adhesive, however, in terms of the fire resistance and the heat resistance, the use of the inorganic adhesive is more preferred. In the second embodiment of the invention, an electrically conductive layer 4 is formed on the surface of the sheet 2.

Specific examples of the hydrated inorganic compound mainly contained in the sheet 2 include sepiolite; a hydrate of aluminum hydroxide, magnesium hydroxide, or calcium hydroxide; gypsum dehydrate; calcium aluminate hydrate; and wollastonite. Among these, sepiolite is mostly preferred. Hereinafter, the invention is described by exemplifying sepiolite for the hydrated inorganic compound.

Sepiolite is a clay mineral usually called mountain leather, mountain cork, or mountain wood, and meerschaum in Japan is a kind of sepiolite. The external appearance of sepiolite may be in a cork form or a leather form, or in a pure-white soft lump, and is generally a lump of magnesium silicate having fibrous properties. Sepiolite has hydroxyl groups having high reactivity on the surface thereof, and has fundamental properties, such as an adsorptivity, a thixotropy, and a consolidating property.

For the electrically conductive material, which is contained as an indispensable component in the sheet 2 in the first embodiment of this invention, any material having electric conductivity may be used without particular restrictions, however, in terms of excellency in radio absorptivity, carbon black, carbon graphite, carbon fibers, etc., are preferably used. The electrically conductive materials may be used singly or as a mixture of two or more thereof.

The sheet 2 is preferably obtained by sheet-manufacturing using a slurry containing sepiolite as a main constituent (in the first embodiment, further contains an electrically conductive material), followed by dehydrating the slurry to form a wet sheet, then drying and solidifying to obtain a sheet. The thickness of the sheet 2 is preferably about 0.2–0.7 mm.

The slurry is prepared by dispersing sepiolite (in the first embodiment, sepiolite and an electrically conductive material) in a binder such as water glass, and further inorganic fibers may be added to as a reinforcing material. Examples of the inorganic fibers include glass fibers, rock wool fibbers, stainless steel fibers, silica-alumina fibers, and potassium titanate fibers. The content of the inorganic fibers is preferably not more than 20 wt % in the total weight of the sheet. As the reinforcing material, organic fibers, such as a wood pulp or aramid fibers, may be further incorporated thereinto. However, in terms of inflammability and sufficient shape-retention keeping, the content of the organic fibers is preferably not more than 5 wt % in the total weight of the sheet.

Furthermore, for improving the binding property of the sheet 2, a synthetic resin such as a thermosetting synthetic resin or a thermoplastic synthetic resin may be added thereto as a binder. For the thermosetting resin, a cationic thermosetting resin, such as polyamidoamine and epichlorohydrin, is preferably used. For the thermoplastic resin, an anionic thermoplastic resin, such as polyacrylamide (molecule weight of about 800,000–1,000,000), etc., is preferably used. However, as sepiolite is excellent in the consolidating property, in the case of using said synthetic resin as a binder, the content thereof is preferably not more than 5 wt %, and such the content substantially does not influence the incombustibility of the sheet.

In order to ensure the sufficient incombustible effect of the invention, the content of sepiolite in the sheet 2 is preferably not more than 90 wt %, and particularly preferred not more than 85 wt %; and is preferably not less than 50 wt %, more preferably not less than 65 wt %, and particularly preferred not less than 75 wt %. The said content corresponds to the content of sepiolite in the total weight of the honeycomb structure.

In the first embodiment of this invention, i.e., in the case of incorporating the electrically conductive material into the honeycomb structure, in terms of ensuring the sufficient radio absorptivity, the content of the electrically conductive material is preferably not more than 30 g/l, and particularly preferred not more than 20 g/l in the total volume (the volume including the cell spaces) of the honeycomb structure; and is preferably not less than 0.5 g/l, and particularly preferred not less than 2 g/l in the total volume (the volume including the cell spaces) of the honeycomb structure.

As one of the preferred specific examples of the slurry in the second embodiment of this invention, a slurry is exemplified comprising 85 wt % of sepiolite, 10 wt % of glass fibers, 3 wt % of a pulp, 1 wt % of vinylon-based fibers, 0.5 wt % of an acrylic resin, and 0.5 wt % of an epoxy resin. In this case, the total weight is 5 wt % of the organic components such as the pulp. The organic components are carbonized under heating temperature conditions of 800–1,000° C., but in the sheet after the carbonization, the strength of the sheet is scarcely deteriorated, and the sheet has a sufficient heat-resisting shape-retention. When the sheet 2 is immersed in water, it is not re-dissolved and the strength thereof is not lowered. The thickness of the sheet 2 is preferably about 0.2–0.7 mm, and particularly preferred about 0.2–0.25 mm.

As one of the preferred specific examples of the first embodiment of this invention, a slurry is exemplified comprising 78 wt % of sepiolite, 10 wt % of an electrically conductive material, 5 wt % of glass fibers, 3 wt % of a pulp, 2 wt % of vinylon-based fibers, 1 wt % of an acrylic resin, and 1 wt % of an epoxy resin.

The concentration of the slurry is preferably about 0.05–0.5 wt %. The wet sheet is obtained by dehydrating the product in the sheet-manufacturing process from the slurry.

In order to improve the strength of the incombustible honeycomb radio absorptive material, the sheet is formed from two or more plural layers, and a glass cloth may be sandwiched between the sheet layers.

Such a sheet of laminated layer structure is obtainable by manufacturing wet sheets from the slurry, then laminating two or more layers of the wet sheets, followed by fixing a glass cloth between each of the layers, and drying them. The fixing of the glass cloth between the layers may be sandwiched between the layers using an inorganic adhesive, or by press-sticking. The glass cloth is commercially available as, for example, "Microglass Roving Cloth" and "Microglass Uniroving" (both are of Nippon Sheet Glass Co., Ltd.), and those are preferably used. The thickness of the glass cloth is preferably about 0.3–0.8 mm, and the total thickness of the sheets is preferably about 0.8–1.3 mm.

The honeycomb structure 1 can be formed by any known means using the sheet 2.

For example, an inorganic adhesive 3 is coated onto the surface of the sheet 2 in stripe forms with a definite width at a constant interval by screen transfer, roller coating, etc. The width of the stripe of the inorganic adhesive 3 determines the length of the cumulated portion of the main body 1 of the honeycomb structure, and by changing the width and pitch of the stripes of the adhesive 3, the form and dimensions of the cells constituting the honeycomb structure main body 1 may be desirably changed. Many sheets 2 each having formed the stripes of the inorganic adhesive 3 are cumulated such that the stripes of the adhesive 3 are shifted from those between the adjacent sheets 2 by a half pitch and they are adhered to each other by pressing them in the vertical direction. Then, the block composed of many sheets 2 adhered to each other is cut in the direction perpendicular to the stripes of the adhesive 3 with a definite width according to the thickness of the desired honeycomb structure. After that, by extending the cut sheets from both sides, a honeycomb main body 1 is formed.

In the second embodiment of the invention, an electrically conductive layer 4 made of an electrically conductive material is formed on the surface of the honeycomb structure 1. The electrically conductive material may be used as the same one as that of described in the first embodiment.

The formation of the electrically conductive layer 4 can be carried out by any ordinary methods. For example, there are a method of preparing an electrically conductive coating liquid having an electrically conductive material dispersed in an inorganic binder and immersing the honeycomb structure 1 in the coating liquid to form an electrically conductive layer onto the surface of the honeycomb structure 1; a method of coating the electrically conductive coating liquid on the surface of the honeycomb structure 1 using a brush and the like; and a method of spraying the electrically conductive coating liquid onto the honeycomb structure 1 by a spray, etc. Of these methods, the method of coating the electrically conductive coating liquid on the surface of the honeycomb structure using a brush, and the method of immersing the honeycomb structure in the coating liquid to form an electrically conductive layer onto the surface thereof are preferred. For the inorganic binder, a water glass-based binder, a silica-alumina-based binder, etc. are exemplified, but not limited to them.

In the second embodiment of the invention, in order to ensure the sufficient radio absorptivity, the content of the electrically conductive material in the electrically conductive layer is preferably not more than 30 g/l, and particularly preferred not more than 20 g/l in the total volume (the volume including the cell spaces) of the honeycomb structure; and is preferably not less than 0.5 g/l, and particularly preferred not less than 2 g/l in the total volume (the volume including the cell spaces) of the honeycomb structure.

An inorganic coat made of water glass, etc., may be formed onto the surface of the incombustible honeycomb radio absorptive material formed as described above. The tensile strength and compressive strength of the incombustible honeycomb radio absorptive material are more increased by the inorganic coat, and the incombustible honeycomb absorptive material is maintained in the extended state of the honeycomb structure. Also, the occurrence of scuffing or peeling off of the fibers on the surface of the sheet 2 is prevented, and further, the fire resistance of the sheet 2 can be more improved.

In this invention, in addition to the content of the electrically conductive material per total volume (the volume including the cell spaces) of the honeycomb structure, the cell size of the honeycomb structure and the thickness of the honeycomb structure give influences on the characteristics of the radio absorber. When the opening of the cell size of the honeycomb structure is too large, an electromagnetic wave is liable to transmit through the absorptive material, and in the case of using said radio absorptive material for an anechoic chamber, the transmitted electromagnetic wave is reflected to the inside of the anechoic chamber by a shield panel disposed on the back surface thereof, and the reflectivity is heightened. When the thickness of the honeycomb structure is too thin, an electromagnetic wave is not sufficiently absorbed, and the reflectivity is heightened. However, when the opening of the cell size of the honeycomb structure becomes smaller or when the thickness of the honeycomb structure becomes thicker, then it leads to the increase of the weight of the radio absorber.

Figure 2:
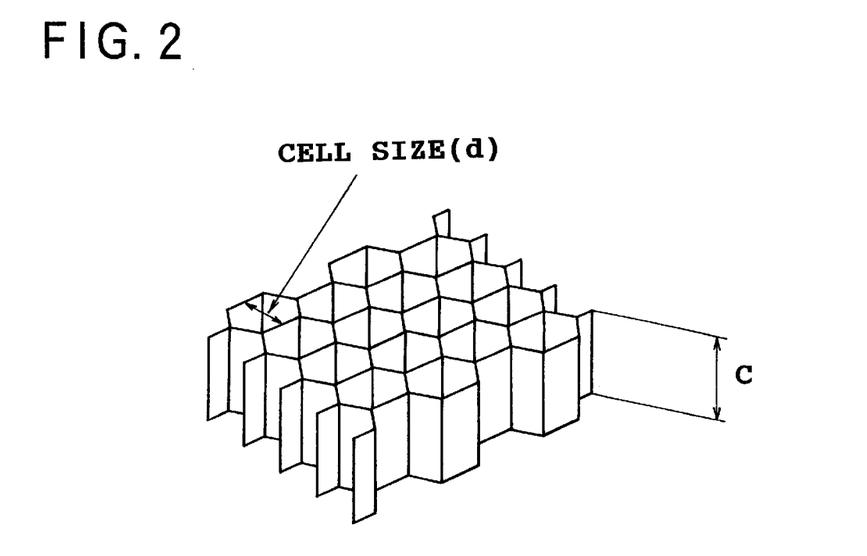
FIG. 2 is a view showing the cell size of the incombustible honeycomb radio absorptive material and the thickness of the absorptive material of this invention.

Considering these points, the upper limit of the cell size of the honeycomb structure is preferably 60 mm, more preferably 50 mm, and particularly preferred 30 mm; and the lower limit of the cell size is preferably 5 mm, and particularly preferred 10 mm. The upper limit of the thickness of the honeycomb structure is preferably 50 mm, and particularly preferred 30 mm; and the lower limit of the thickness of the honeycomb structure is preferably 10 mm, and particularly preferred 15 mm. The cell size of the honeycomb structure means the size shown by "d" in FIG. 2, and the thickness of the honeycomb structure means the thickness shown by "c" in FIG. 2.

Figure 3:
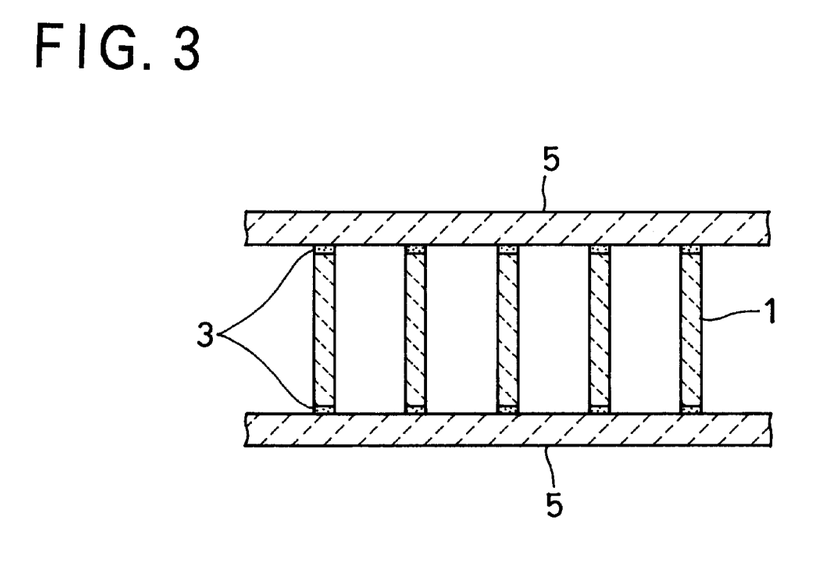
FIG. 3 is a partial cross-sectional view showing another embodiment of the incombustible honeycomb radio absorptive material of this invention.

In this invention, an incombustible sheet material 5 may be stuck to at least one surface of the honeycomb structure 1 as shown in FIG. 3. FIG. 3 shows the embodiment of sticking the materials onto the both surfaces of the honeycomb structure 1. The incombustible sheet material 5 may be stuck to by using an inorganic adhesive 3. By sticking of the incombustible sheet material 5, the mechanical strength of the structure is improved, and the radio absorber structure described hereinafter is easily to be assembled, and the occurrence of the strain and deformation due to its own weight can be more effectively prevented. The incombustible sheet material 5 containing a hydrated inorganic compound, preferably sepiolite, as a main constituent is preferably used as in the case of the sheet 2, and is obtainable in the same way as the sheet 2. The thickness of the incombustible sheet material 5 is preferably about 0.5–3.0 mm. The incombustible sheet materials 5, 5 having a different thickness from each other may be stuck to the both surfaces of the honeycomb structure 1, respectively. The surface (the opposite side to the sticking-side to the honeycomb structure 1) of the incombustible sheet material 5 may be applied with an embossing work, whereby being able to apply a beautiful decoration of the surface of a radio absorber.

The incombustible honeycomb radio absorptive materials in the first and second embodiments of the invention may be applied to radio absorbers in various manners. For example, there are a method of disposing the sheet-form incombustible honeycomb radio absorptive material on a shield panel or a ferrite tile covering the shield panel such that the support of the incombustible honeycomb radio absorptive material is aligned in a perpendicular direction to the surface of the panel; and a method of constructing the sheet-form incombustible honeycomb radio absorptive material previously cut and worked such that it becomes a hollowed square pyramid form or a hollowed wedge form and disposing the incombustible honeycomb radio absorptive material on a shield panel or on a ferrite tile covering the panel, etc. The latter method is preferred in view of the capability of radio absorptivity of an electromagnetic wave of a low frequency.

Figure 4:
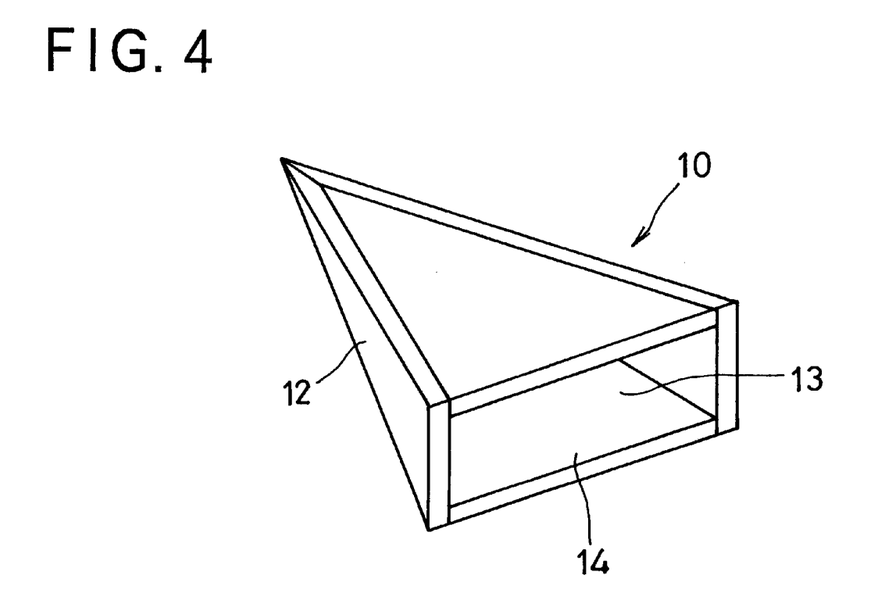
FIG. 4 is a schematic slant view showing an embodiment of the assembly for a radio absorber using the incombustible honeycomb radio absorptive materials of this invention.
Figure 5:
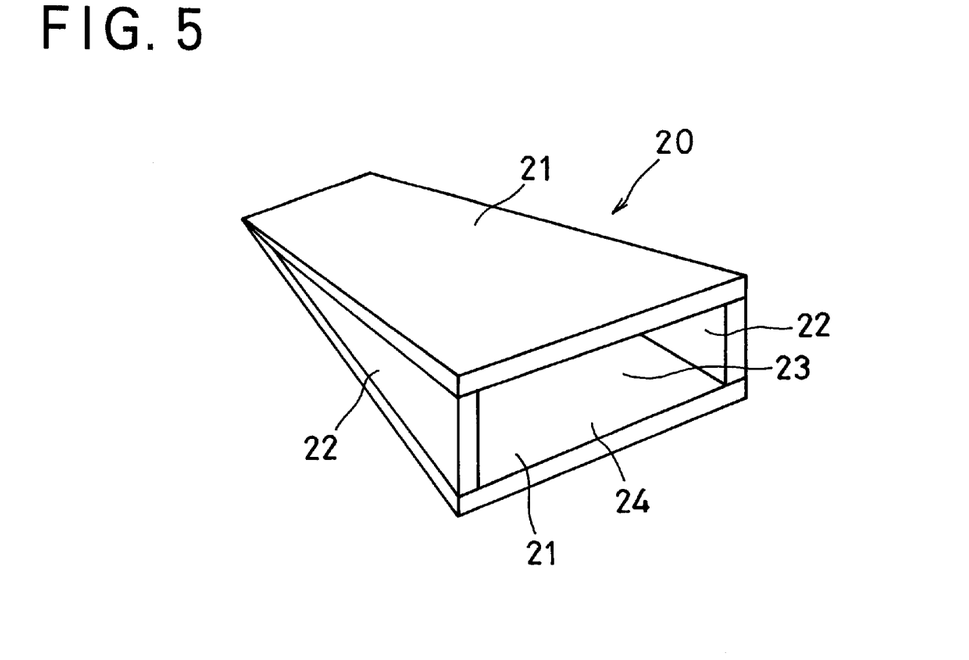
FIG. 5 is a schematic slant view showing another embodiment of the assembly for a radio absorber using the incombustible honeycomb radio absorptive materials of this invention.
Figure 6:
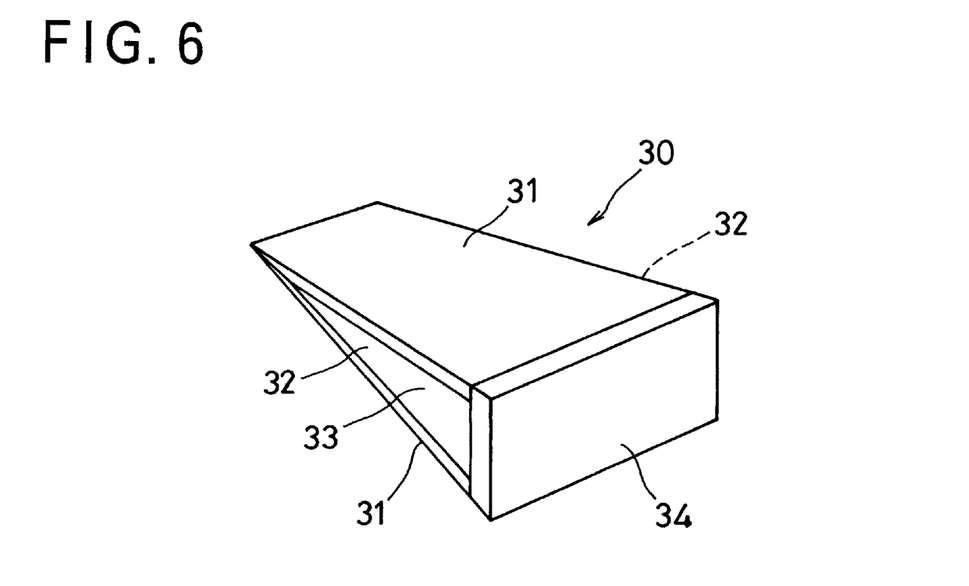
FIG. 6 is a schematic slant view showing a still another embodiment of the assembly for a radio absorber using the incombustible honeycomb radio absorptive materials of this invention.

FIGS. 4–6 are schematic slant views showing specific examples of preferred assembly forms (assemblies for radio absorbers) of radio absorptive materials for forming radio absorbers of this invention.

A radio absorber assembly 10 shown in FIG. 4 has a square pyramid form. The radio absorber assembly 10 has four sheets of side wall portions 12 of an isosceles triangle form, the inside thereof is a hollow structure 13 for weight reduction, and an opening 14 is formed at the bottom portion.

The radio absorber assembly 20 shown in FIG. 5 has a wedge form. The radio absorber assembly 20 has inclined portions 21, 21 and side wall portions 22, 22 each disposed between the inclined portions, the inside is a hollow structure 23 for weight reduction, and an opening 24 is formed at the bottom portion.

The radio absorber assembly 30 shown in FIG. 6 has a wedge form. The radio absorber assembly 30 has inclined portions 31, 31 and a bottom portion 34, side wall portions disposed between the inclined portions form openings 32, 32, and the inside thereof is a hollow structure for weight reduction.

Each assembly is formed by using an inorganic adhesive or an organic one. For the inorganic adhesive, the same one as described hereinbefore is preferably used, and for the organic adhesive, an epoxy-based one is preferably used.

Figure 7:
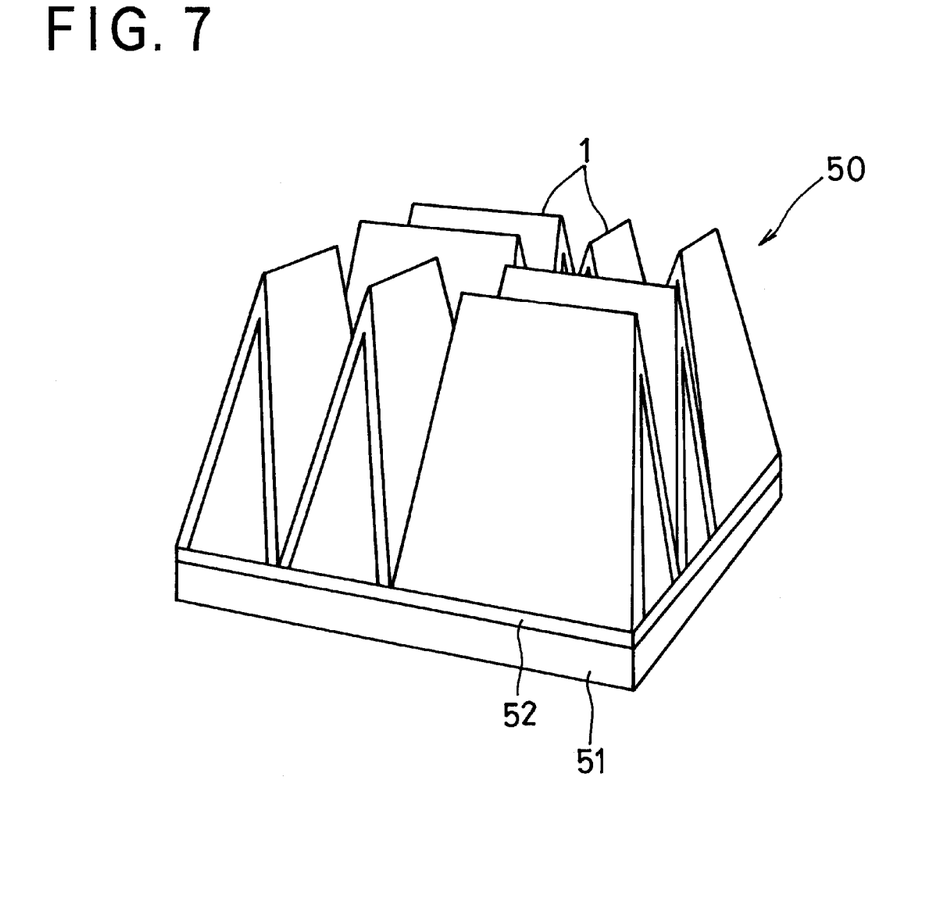
FIG. 7 is a schematic slant view showing an embodiment of the radio absorber of this invention.

And then, as shown in FIG. 7, by disposing the respective radio absorber assemblies on a shield panel 51 such that the bottom surface of each assembly is in contact with the upper surface of the panel, the radio absorber 50 of the invention can be obtained.

Also, if desired, a radio absorptive ferrite tile 52 may be formed on the shield panel 51, and by disposing the radio absorber assembly on the ferrite tile 52 in the above-described manner, the radio absorber 50 of the invention may be obtained.

Ordinary shield panels and ferrite tiles may be used.

The incombustible honeycomb radio absorptive materials of this invention can be handled as sheet-form incombustible honeycomb radio absorptive materials at transporting the materials before assembling them as many three-dimensional radio absorber structures. As the incombustible honeycomb radio absorptive materials can be transported as sheet-form radio absorptive materials but not as three-dimensional structures, they are not bulky and the occurrence of breakage of them by contacting, can be easily prevented.

In addition, in order to protect the tip portion of the radio absorber or prevent the spiritual oppressive sensation caused by color, form, and anechoic sound of the radio absorber, a flat radio transmitter may be placed on the front surface of the radio absorber. It is preferred that the radio transmitter is lightweight and has the property of transmitting a radio wave without reflecting it and without reducing the characteristics of the radio absorber.

When constructing an anechoic chamber using the radio absorber of this invention, the shied panel is placed in a perpendicular direction as a wall surface such that the tips of the assembly disposed on the panel turn the horizontal direction. The construction of the chamber can be carried out by an ordinary method.

The incombustible honeycomb radio absorptive material of this invention and the radio absorber of this invention using said material are particularly excellent in the attenuation effect of the electromagnetic waves of the frequency of from about 30 MHz to 18 GHz. By applying the present invention to an anechoic chamber, the radio absorber is obtained, which is excellent in incombustibility and radio absorptivity, is lightweight, and is not deformed by its own weight.

The following Examples are intended to illustrate the present invention in more detail but not to limit the invention in any way.

EXAMPLE 1

Carbon graphite ("Blue P" of Nippon Kokuen K.K.) was dispersed in an inorganic binder ("FJ 803" of Tokiwa Electric Co.) such that the content thereof was 20 wt %, to obtain an electronically conductive coating liquid.

Then, the electronically conductive liquid was coated onto the surface of a honeycomb structure ("Ceramic Honeycomb" of Tokiwa Electric Co.; cell size 20 mm, thickness 20 mm, containing 85 wt % sepiolite) such that the content of the carbon graphite was 4 g/l in the total volume (the total volume including the cell spaces) of the honeycomb structure, followed by drying it to form an electrically conductive layer.

The honeycomb structure having the electrically conductive layer formed thereon was cut to prepare a board of 650 mm×1,400 mm×20 mm. Then, from the board, two cut pieces of a trapezoid form having an upper side of 400 mm, a lower side of 600 mm, and a height of 1,050 mm were obtained. Using each cut piece thusly obtained, a wedge-form radio absorber assembly having a bottom area of 600 mm×600 mm and a height of 1,000 mm was prepared. The specific gravity of the wedge-form radio absorber assembly was 0.04 g/cm³.

EXAMPLE 2

An incombustible sheet material (thickness: 1.5 mm) was stuck to both surfaces of the honeycomb structure having the electrically conductive layer obtained in Example 1, using an inorganic adhesive (a mixture of potassium silicate and antimony pentaoxide).

The incombustible sheet material was produced as follows. Firstly, a slurry for the incombustible sheet having the following composition was prepared using a Henschel mixer.

(Composition of slurry for incombustible sheet)

| | |
|---|---|
| Sepiolite ("Aid Plus" of Mizusawa Industrial Chemicals, Ltd.) | 85 parts by weight |
| Glass fibers (of Nitto Boseki Co., Ltd.) | 10 parts by weight |
| Organic binder | 5 parts by weight |

Then, using this slurry, incombustible sheets having a thickness of 0.5 mm were manufactured. By laminating the incombustible sheets using the above-described adhesive, an incombustible sheet material having a thickness of 1.5 mm was produced.

The honeycomb structure having the thus-produced incombustible sheet material stuck to both surfaces thereof was cut into a board of 650 mm×1,400 mm×23 mm. Then, from the board, two cut pieces of a trapezoid form having an upper side of 400 mm, a lower side of 600 mm, and a height of 1,050 mm were obtained. Using each cut piece, a wedge-form radio absorber assembly having a bottom area of 600 mm×600 mm and a height of 1,000 mm was prepared. The specific gravity of the wedge-form radio absorber assembly was 0.13 g/cm³.

EXAMPLE 3

Carbon fibers ("Dialead" of Mitsubishi Chemical Corporation, fiber length: 10 mm) was dispersed in an inorganic binder ("FJ 803" of Tokiwa Electric Co.) such that the content thereof was 10 wt %, to obtain an electrically conductive coating liquid.

Then, the electrically conductive coating liquid was coated onto both surfaces of a honeycomb structure ("Ceramic Honeycombs" of Tokiwa Electric Co.; cell size 20 mm, thickness 20 mm, containing 85 wt % sepiolite) such that the content of the carbon fibers was 3 g/l in the total volume (the total volume including the cell spaces) of the honeycomb structure, followed by drying it to form an electrically conductive layer.

The honeycomb structure having the electrically conductive layer formed thereon was cut to prepare a board of 650 mm×1,400 mm×20 mm. Then, from the board, two cut pieces of a trapezoid form having an upper side of 400 mm, a lower side of 600 mm, and a height of 1,050 mm were obtained. Using each cut piece thusly obtained, a wedge-form radio absorber assembly having a bottom area of 600 mm×600 mm and a height of 1,000 mm was prepared. The specific gravity of the wedge-form radio absorber assembly was 0.04 g/cm³.

EXAMPLE 4

After manufacturing a sheet from a slurry comprising 85 wt % of sepiolite, 9 wt % of carbon fibers ("Dialead" of Mitsubishi Chemical Corporation; fiber length: 10 mm), 1 wt % of glass fibers, 3 wt % of a pulp, 1 wt % of vinylon-base fibers, 0.5 wt % of an acrylic resin, and 0.5 wt % of an epoxy resin, a dehydration treatment was carried out to provide a wet sheet. Then, a two-layered wet sheet was prepared, and after that a glass cloth was sandwiched between the layers, followed by drying and solidifying.

Using this two-layered sheet, a honeycomb structure [cell size: 20 mm, thickness: 20 mm, the content of the carbon fibers in the total volume (total volume including the cell spaces) of the honeycomb structure: 3 g/l] was prepared.

By cutting the honeycomb structure, a board of 650 mm×1,400 mm×20 mm was prepared. Then, from the board, two cut pieces of a trapezoid form having an upper side of 400 mm, a lower side of 600 mm, and a height of 1,050 mm were obtained. Using each cut piece thusly obtained, a wedge-form radio absorber assembly having a bottom area of 600 mm×600 mm and a height of 1,000 mm was prepared. The specific gravity of the wedge-form radio absorber assembly was 0.04 g/cm³.

EXAMPLE 5

Carbon graphite ("Blue P" of Nippon Kokuen K.K.) was dispersed in an inorganic binder ("FJ 803" of Tokiwa Electric Co.) such that the content thereof was 30 wt %, to obtain an electronically conductive coating liquid.

Then, the electronically conductive liquid was coated onto the surface of a honeycomb structure ("Ceramic Honeycomb" of Tokiwa Electric Co.; cellsize: 30 mm, thickness: 30 mm, containing 85 wt % sepiolite) such that the content of the carbon graphite was 18 g/l in the total volume (the total volume including the cell spaces) of the honeycomb structure, followed by drying it to form an electrically conductive layer.

The honeycomb structure having the electrically conductive layer formed thereon was cut to prepare a board of 650 mm×1,400 mm×30 mm. Then, from the board, two cut pieces of a trapezoid form having an upper side of 400 mm, a lower side of 600 mm, and a height of 1,050 mm were obtained. Using each cut piece thusly obtained, a wedge-form radio absorber assembly having a bottom area of 600 mm×600 mm and a height of 1,000 mm was prepared. The specific gravity of the wedge-form radio absorber assembly was 0.07 g/cm³.

EXAMPLE 6

Carbon graphite ("Blue P" of Nippon Kokuen K.K.) was dispersed in an inorganic binder ("FJ 803" of Tokiwa Electric Co.) such that the content thereof was 10 wt %, to obtain an electronically conductive coating liquid.

Then, the electronically conductive liquid was permeated in the surface of a honeycomb structure ("Ceramic Honeycomb" of Tokiwa Electric co. ; cell size: 10 mm, thickness: 20 mm, containing 85 wt % sepiolite) such that the content of the carbon graphite was 1 g/l to the honeycomb structure, followed by drying it to form an electrically conductive layer.

The honeycomb structure having the electrically conductive layer formed thereon was cut to prepare a board of 650 mm×1,400 mm×20 mm. Then, from the board, two cut pieces of a trapezoid form having an upper side of 400 mm, a lower side of 600 mm, and a height of 1,050 mm were obtained. Using each cut piece thusly obtained, a wedge-form radio absorber assembly having a bottom area of 600 mm×600 mm and a height of 1,000 mm was prepared. The specific gravity of the wedge-form radio absorber assembly was 0.06 g/cm$^3$.

Then, using the wedge-form radio absorber assemblies obtained in Examples 1–6 described above, the measurement of the radio absorption effect and the incombustibility test were carried out by the following methods.

Radio Absorption Effect

Onto the surface of the bottom of each of the wedge-form radio absorber assemblies (the type shown by numeral 20 of FIG. 5) obtained in Examples 1–6 was formed a ferrite tile 52 ("Ferrite IB-011" of TDK Corporation, thickness: 5.9 mm), and further a shield panel 51 was disposed at the back surface thereof (see FIG. 7).

Figure 8:
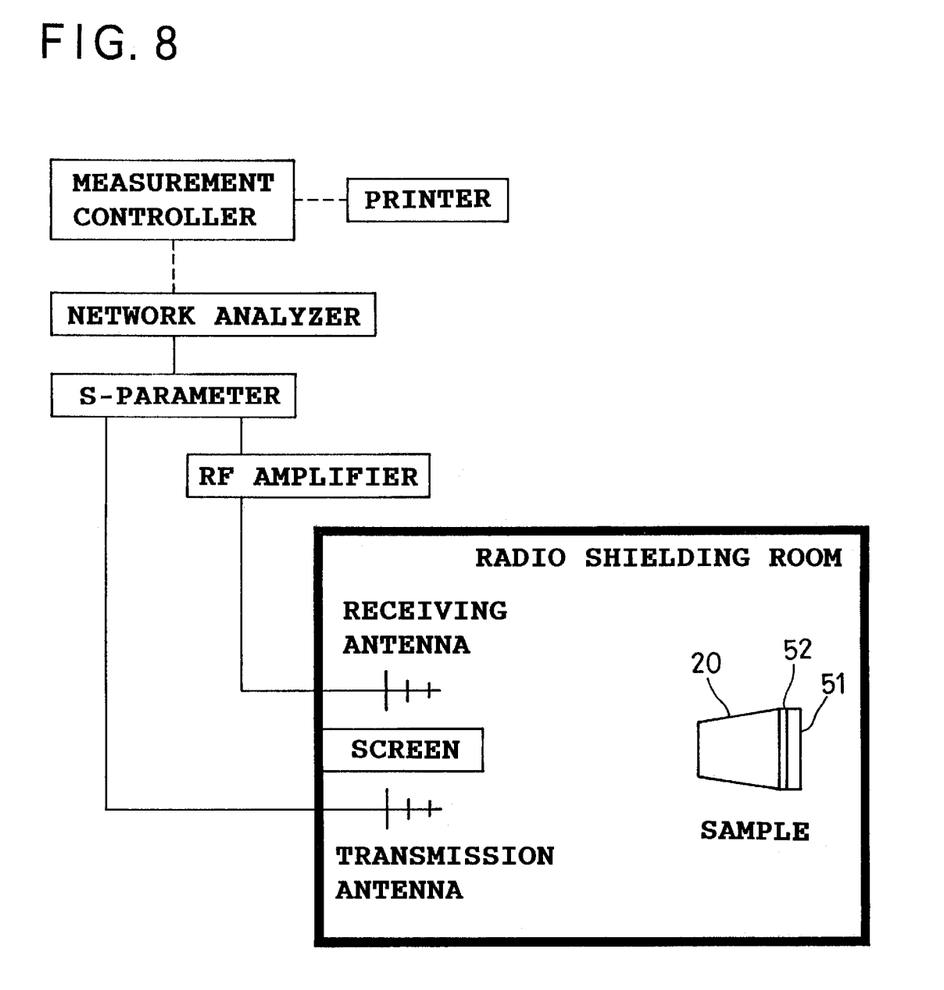
FIG. 8 is a block view showing a measuring method of the radio absorption effect carried out in the Examples of this invention.

Using the wedge-form radio absorber assembly 20 in this state, as is indicated in the measurement-series block shown in FIG. 8, each wedge-form radio absorber assembly 20 was irradiated with a radio wave, and the reflected wave level was measured in the anechoic chamber.

The reflectivity (dB) of each wedge-form radio absorber assembly 20 was calculated by the equation shown below with the reflection level of a metal sheet only having the same size (600 mm×600 mm) as the bottom surface of the radio absorber assemblies as a standard.

Reflectivity (dB)=(the reflection level (dB) of the sample)−(the reflection level (dB) of the metal sheet)

The reflectivity at 1 GHz measured by the above-described method was −26 dB in Example 1; −24 dB in Example 2; −28 dB in Example 3; −21 dB in Example 4; −24 dB in Example 5; and −20 dB in Example 6, respectively.

Incombustibility test

The test was carried out according to the test method of an incombustible material regulated by the Notification No. 1828 of the Ministry of Assembly, Japan. That is, firstly, using an inorganic adhesive ("FJ 294" of Tokiwa Electric co.), the honeycomb structural bodies obtained in each of Examples 1–6 were laminated to prepare test samples of 40 mm×40 mm×50 mm. Then, each test sample was heated in a furnace to 750° C.±10° C. for 20 minutes, and the temperature rise of the test sample by the heating was measured. When the temperature rise (over 750° C.±10° C.) of the test sample is lower than 50° C., then the said sample is judged as being incombustible.

As the results of the incombustibility test measured by the above-described method, the temperature rise of the test sample was 769° C. in Example 1; 759° C. in Example 2; 770° C. in Example 3; 773° C. in Example 4; 784° C. in Example 5; and 768° C. in Example 6.

Measurement of mechanical strength

Furthermore, about the sample obtained in Example 2, a bending strength was measured according to JIS A1408. That is, from the honeycomb structure obtained in Example 2, a test piece having a length of 200 mm, a width of 150 mm, and a thickness of 18 mm (including 1.5 mm of each thickness of the incombustible sheet material formed at both surfaces thereof) was prepared, and after allowing stand the test piece in an air-drying state, a bending strength was measured at a pressing speed of 1 mm/minute. As the result, the bending strength was 110 kgf/cm$^2$.

As described above in detail, according to this invention, an incombustible honeycomb radio absorptive material which has high incombustibility, is excellent in radio absorptivity, is lightweight, and has a high strength, as well as a radio absorber using said material are obtained. The present invention is particularly suitably applied to an anechoic chamber.

What is claimed is:

1. An incombustible honeycomb radio absorptive material forming a honeycomb structure that is an aggregate of many cells, wherein said honeycomb structure contains a hydrated inorganic compound and an electrically conductive material.

2. The incombustible honeycomb radio absorptive material according to claim 1, wherein the content of the electrically conductive material is 0.5–30 g/l in the total volume (the total volume including cell spaces) of the honeycomb structure.

3. The incombustible honeycomb radio absorptive material according to claim 1, wherein the content of the hydrated inorganic compound is 50–90 wt % in the total weight of the honeycomb structure.

4. The incombustible honeycomb radio absorptive material according to claim 1, wherein the size of each cell is 5–60 mm and a thickness of the honeycomb structure is 10–50 mm.

5. The incombustible honeycomb radio absorptive material according to claim 1, wherein the incombustible honeycomb radio absorptive material is obtainable by manufacturing wet sheets from a slurry containing the hydrated inorganic compound and the electrically conductive material, then drying and solidifying the wet sheets to form sheets, followed by laminating said sheets in a honeycomb form.

6. The incombustible honeycomb radio absorptive material according to claim 5, wherein the slurry further contains inorganic fibers as a reinforcing material.

7. The incombustible honeycomb radio absorptive material according to claim 5, wherein the sheets are plural-layered, and a glass cloth is sandwiched between each sheet layers.

8. The incombustible honeycomb radio absorptive material according to claim 1, wherein the hydrated inorganic compound is at least one member selected from sepiolite; a hydrate of aluminum hydroxide, magnesium hydroxide, or calcium hydroxide; gypsum dihydrate, calcium aluminate hydrate, and wollastonite.

9. The incombustible honeycomb radio absorptive material according to claim 8, wherein the hydrated inorganic compound is sepiolite.

10. The incombustible honeycomb radio absorptive material according to claim 1, wherein an incombustible sheet material is stuck to at least one surface of the honeycomb structure.

11. An incombustible honeycomb radio absorptive material forming a honeycomb structure that is an aggregate of many cells, wherein said honeycomb structure contains a hydrated inorganic compound, and has an electrically conductive layer made of an electrically conductive material formed on the surface of the honeycomb structure.

12. The incombustible honeycomb radio absorptive material according to claim 11, wherein the content of the electrically conductive material is 0.5–30 g/l in the total volume (the total volume including cell spaces) of the honeycomb structure.

13. The incombustible honeycomb radio absorptive material according to claim 11, wherein the content of the hydrated inorganic compound is 50–90 wt % in the total weight of the honeycomb structure.

14. The incombustible honeycomb radio absorptive material according to claim 11, wherein the size of each cell is 5–60 mm and a thickness of the honeycomb structure is 10–50 mm.

15. The incombustible honeycomb radio absorptive material according to claim 11, wherein the incombustible honeycomb radio absorptive materila is obtainable by manufacturing wet sheets from a slurry containing the hydrated inorganic compound, then drying and solidifying the wet sheets to form sheets, followed by laminating said sheets in a honeycomb form.

16. The incombustible honeycomb radio absorptive material according to claim 11, wherein the slurry further contains inorganic fibers as a reinforcing material.

17. The incombustible honeycomb radio absorptive material according to claim 11, wherein the sheets are plural-layered, and a glass cloth is sandwiched between each sheet layers.

18. The incombustible honeycomb radio absorptive material according to claim 11, wherein the hydrated inorganic compound is at least one member selected from sepiolite; a hydrate of aluminum hydroxide, magnesium hydroxide, or calcium hydroxide; gypsum dihydrate, calcium aluminate hydrate, and wollastonite.

19. The incombustible honeycomb radio absorptive material according to claim 18, wherein the hydrated inorganic compound is sepiolite.

20. The incombustible honeycomb radio absorptive material according to claim 11, wherein an incombustible sheet material is stuck to at least one surface of the honeycomb structure.

21. A radio absorber wherein a large number of the incombustible honeycomb radio absorptive materials as recited in either claim 1 or claim 11 are disposed on a shield panel or a ferrite tile covering the shield panel.

22. The radio absorber according to claim 21, wherein the incombustible honeycomb radio absorptive material each is formed in a hollowed square pyramid form or a hollowed wedge form, and the thusly formed materials are disposed on a shield panel or a ferrite tile covering the shield panel.

* * * * *